United States Patent [19]

Gladfelter et al.

[11] Patent Number: 4,923,717
[45] Date of Patent: May 8, 1990

[54] PROCESS FOR THE CHEMICAL VAPOR DEPOSITION OF ALUMINUM

[75] Inventors: Wayne L. Gladfelter, St. Paul; David C. Boyd, Minneapolis, both of Minn.

[73] Assignee: Regents of the University of Minnesota, Minneapolis, Minn.

[21] Appl. No.: 325,381

[22] Filed: Mar. 17, 1989

[51] Int. Cl.⁵ .................. C23C 16/06; C23C 16/08; C23C 16/18

[52] U.S. Cl. .................. 427/252; 427/253; 427/255; 427/255.7; 427/404

[58] Field of Search ............ 427/252, 253, 255, 255.7, 427/164, 166, 404

[56] References Cited

U.S. PATENT DOCUMENTS

| | | | |
|---|---|---|---|
| 3,206,326 | 9/1965 | Whaley | 427/252 |
| 3,375,129 | 3/1968 | Carley et al. | 427/252 |
| 3,462,288 | 8/1969 | Schmidt et al. | 427/252 |
| 3,563,787 | 2/1971 | Schneggenburger et al. | 427/404 |
| 3,787,225 | 1/1974 | Roberts et al. | 427/252 |
| 3,979,273 | 9/1976 | Panzera et al. | 427/252 |
| 4,353,938 | 10/1982 | Sterling et al. | 427/404 |

OTHER PUBLICATIONS

M. J. Cooke et al., *Solid State Technol.*, 25, 62 (1982).
R. A. Levy et al., *J. Electrochem. Soc.*, 131, 2175 (1984).
M. L. Green et al., *Thin Solid Films*, 114, 367 (1984).
R. A. Levy et al., *J. Electrochem. Soc.*, 134, 37C (1987).
T. Kobayashi et al., *Abstracts of Papers*, Fall Meeting, Boston, MA; Materials Research Society: Pittsburgh, PA, E9.47 (1988).
T. Kobayashi et al., *Jap. J. Appl. Phys.*, 27, L1775 (1988).
R. A. Kovar et al., *Inorg. Synth.*, 17, 36 (1977).
E. Wiberg et al., *Hydrides of the Elements of Main Groups I-IV*, Elsevier: Amsterdam, Ch. 5 (1971).
T. H. Baum et al., *Abstracts of Papers*, Fall Meeting, Boston, MA; Materials Research Society: Pittsburgh, PA B4.12 (1988).
M. L. Green et al., *J. of Metals*, 63 (Jun. 1985).
C. W. Heitsch, *Nature*, 195, 995 (1962).
G. N. Nechiporenko et al., *Izv. Akad. Nauk SSSR, Ser. Khimicheskaya*, 1697 (1975).
A. Sekiguchi et al., *Jap. J. Appl. Phys.*, 27, 364 (1988).

Primary Examiner—Sadie Childs
Attorney, Agent, or Firm—Merchant, Gould, Smith, Edell, Welter & Schmidt

[57] ABSTRACT

A method for forming aluminum films is provided comprising employing the techniques of chemical vapor deposition to thermally decompose a vapor comprising a aluminum hydride subsequent to the treatment of the substrate with a Group IVB or VB metal complex, so as to deposit a mirror-like coating of aluminum on the surface of a substrate.

11 Claims, 7 Drawing Sheets

PROCESS FOR THE CHEMICAL VAPOR DEPOSITION OF ALUMINUM

This invention was made with the support of the National Science Foundation under Grant No. CHE-8711821. The Government has certain rights to this invention.

FIELD OF THE INVENTION

This invention relates to the chemical vapor deposition of mirror-like thin films of aluminum.

BACKGROUND OF THE INVENTION

A variety of physical and chemical deposition procedures have been used to prepare aluminum (Al) films. These methods are of interest, in part, because thin films of aluminum have many uses due to their high electrical conductivity, high reflectivity, mechanical strength, and their resistance to chemical attack. There is much current interest in generating thin films of aluminum using chemical vapor deposition (CVD), particularly resulting from applications in the microelectronics industry. In a typical CVD process, organoaluminum precursors are volatilized and then decomposed to yield aluminum, which is deposited as a film on the target substrate.

The generation of aluminum films using triisobutylaluminum (TIBA) has been reported. Typical deposition conditions generally require relatively high substrate temperatures, however. For example, the low pressure CVD of aluminum on silicon or other substrates using TIBA requires a substrate temperature of 260° C., TIBA temperature of 45° C., with argon as the carrier gas at pressures up to 1 torr. These conditions resulted in Al deposition rates of up to 0.15 $\mu$m/min. See M. J. Cooke et al., *Solid State Technol.*, 25, 62 (1982). The films produced by such methods have low resistivities (2.8 to 3.5 $\mu\Omega$-cm) and other properties that are comparable to the properties of aluminum films prepared by evaporative techniques. See R. A. Levy et al., *J. Electrochem. Soc.*, 131, 2175 (1984). However, a major disadvantage observed using TIBA is the rough morphology of the Al film, which leads to poor reflective properties.

Improved aluminum film uniformity, particularly on nonmetallic surfaces such as silicon, has been obtained by pretreating the substrate surface with $TiCl_4$ prior to deposition of aluminum using TIBA as a precursor by chemical vapor deposition. See R. A. Levy et al., *J. Electrochem. Soc.*, 134, 37C (1987); M. J. Cooke et al., vide supra; M. L. Green et al., *Thin Solid Films*, 114, 367 (1984); and R. A. Levy et al., vide supra. Although the aluminum films are more uniform, they may not be highly reflective. Recently, a method of preheating TIBA to a temperature of 230° C. with the substrates at 400° C. has produced aluminum films with reflectivities of 90% and epitaxial Al<111> growth on Si<111>. See T. Kobayashi et al., *Jap. J. Appl. Phys.*, 27, L1775 (1988) and T. Kobayashi et al., *Abstracts of Papers*, Fall Meeting, Boston, MA; Materials Research Society: Pittsburgh, Pa., E9.47 (1988).

Other sources of aluminum have been used as precursors in aluminum plating processes. For example, D. L. Schmidt et al., U.S. Pat. No. 3,462,288 (1969), describe the use of aluminum hydrides such as $AlH_2Cl$, $LiAlH_4$, and $AlH_2(i-C_4H_9)$ with a decomposition catalyst in an electroless solution plating process. In C. B. Roberts et al., U.S. Pat. No. 3,787,225 (1974), aluminum hydride-ether complexes were contacted with trimethylamine vapor in the presence of a decomposition catalyst.

A series of stable, volatile donor-acceptor complexes of alane ($AlH_3$) have been known for many years. They can be generally represented by $D \cdot AlH_3$, and can be readily synthesized in one step from $LiAlH_4$. These donor-acceptor complexes of alane are air sensitive, but they are not pyrophoric, as are the trialkylaluminums. Among the known donors (D) are $Me_3N$, $Et_3N$, $Me_3P$, $Me_2S$, and tetrahydrofuran (THF). See, for example, E. Wiberg et al., *Hydrides of the Elements of Main Groups I-IV*, Elsevier: Amsterdam, Ch. 5 (1971); and R. A. Kovar et al., *Inorg. Synth.*, 17, 36 (1977). Trimethylamine is unique among these donors in its ability to form a bis complex with alane, i.e., $(Me_3N)_2AlH_3$.

The use of amine-alane complexes for the vapor phase deposition of aluminum have been described in T. P. Whaley et al., U.S. Pat. No. 3,206,326 (1965), and in D. R. Carley et al., U.S. Pat. No. 3,375,129 (1968). These methods, however, do not produce mirror-like coatings. Rather, less reflective "shiny" and "metallic" surfaces result. Laser-induced deposition of aluminum using amine-alane complexes has been disclosed in T. H. Baum et al., *Abstracts of Papers*, Fall Meeting, Boston, Mass.; Materials Research Society: Pittsburgh, Pa., B4.12 (1988).

Therefore, a need exists for a process to deposit a mirror-like coating of aluminum having low resistivity using precursors that will permit the use of substantially lower deposition temperatures in the CVD process.

BRIEF DESCRIPTION OF THE INVENTION

Figure 1:
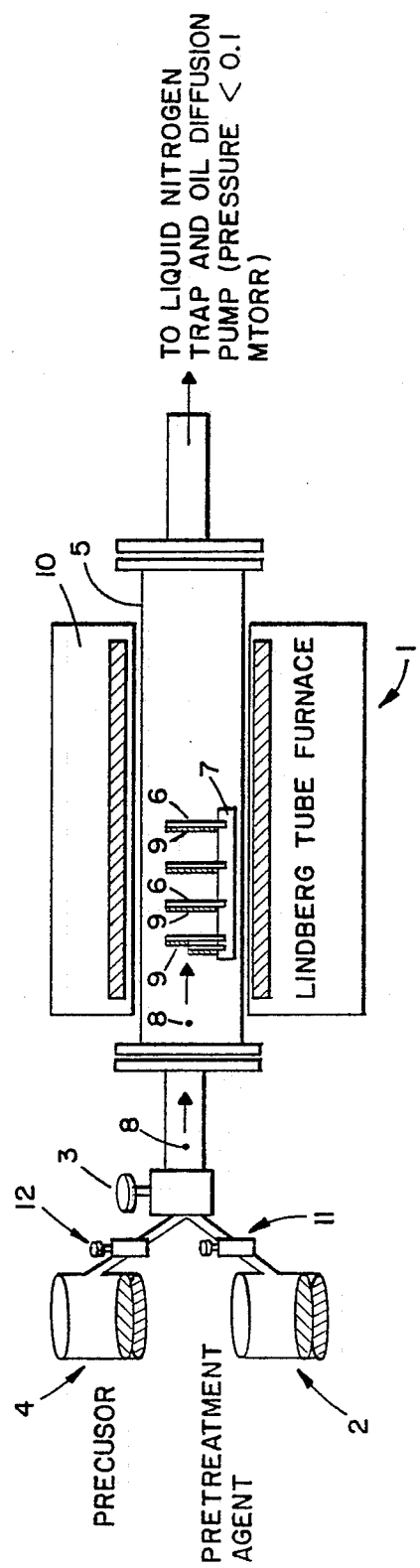
FIG. 1 is a schematic representation of the low pressure chemical vapor deposition reactor used in accord with the present method.

The present invention provides a method for applying a mirror-like aluminum film to the surface of a substrate by employing the techniques of chemical vapor deposition in a flow-through system. Prior to deposition of the aluminum, the substrate surface is exposed to a first vapor comprising a Group IVB or VB metal complex. The source of aluminum is a second vapor comprising an aluminum precursor, which is thermally decomposed so as to deposit a mirror-like coating of aluminum on the substrate surface. The aluminum precursor is of the formula $[(R^1R^2R^3)Y]_xAlH_3$ wherein: Y is a Group VA element; $R^1$, $R^2$ and $R^3$ are independently an alkyl, alkenyl, alkynyl, cycloalkyl, cycloalkenyl, alkaryl, aryl, or aralkyl group; and x is an integer having a value of 1 or 2.

Herein, a "mirror-like" finish refers to a highly reflective surface. Generally, this type of finish is associated with a specular reflectivity of greater than about 80%. That is, the intensity of the radiation reflected at the specular angle, i.e., the radiation that is reflected at an angle with the surface equal to the angle between the incident radiation and the surface, is much greater than the diffuse reflectivity. Mirror-like finishes of aluminum as described herein typically result from a generally uniform distribution of very small particles, i.e., with a grain size of less than about 0.2 μm.

The substrate upon which the aluminum is deposited according to the method of this invention is a material of use in the electronics, optics, or metals-on-polymers industries. In certain applications, the aluminum film will function as an electrically conductive interconnect in microelectronic circuits. For example, see K. L. Chopra et al., *Thin Film Device Applications*; Plenum, N.Y. (1983); M. L. Green and R. A. Levy, *J. of Metals* (June 1985) at page 63. Therefore, useful substrates for aluminum film coating include silicon, tin oxide ($SnO_2$), gallium arsenide (GaAs), silica, glass, polyimide, polymethyl-methacrylate, and other polymers. Additional substrates that can be coated with aluminum using this method include cloth, paper, graphite, ceramic materials, and other metals. It is to be understood, however, that this method is not limited to the above-listed materials, since it is not substrate-specific.

The CVD process is carried out in a flow-through, horizontal, low pressure chemical vapor deposition reactor equipped with a first vessel containing the pretreating agent and a second vessel containing the aluminum precursor. A substrate placed in the reactor is contacted with a first vapor of the pretreating agent, and then contacted with a second vapor of the aluminum precursor. Prior to exposing the substrate to the aluminum precursor, and subsequent to exposing it to the pretreatment agent, the reactor may be evacuated for a short period of time. The precursor and pretreating, or pretreatment, agent are maintained at a constant temperature, usually below their respective decomposition temperatures and generally at or below room temperature, and the substrate is maintained at about room temperature or above, preferably at about 25° C. to 200° C., most preferably at about 50° C. to 150° C.

Using the method of the invention, thin aluminum films of varying thicknesses can be prepared. For example, with the pretreatment agent maintained at 10° C., the aluminum precursor at 25° C., and using a substrate temperature of 180° C., for a 4 minute deposition time, a 4 μm film of Al can be deposited on Si<100>. Films of about 0.05 μm (500 Å) to 5 μm can be readily formed under these reaction conditions, but the thickness can be varied considerably, and is dependant upon the deposition time and rate. The rate of deposition can be varied in a number of ways. For example, the precursor temperature can be lowered to decrease the mass flow of the precursor upon vaporization, or an inert carrier gas can be used to dilute the precursor vapor.

DETAILED DESCRIPTION OF THE INVENTION

Reactor and Reaction Conditions

As shown in FIG. 1, the CVD process is generally carried out in a flow-through, horizontal, low pressure chemical vapor deposition reactor (LPCVD) (1). A pretreatment agent comprised of a Group IVB or VB metal complex, e.g., $TiCl_4$, contained in a first reservoir (2) at one end of the reactor is exposed to a vacuum by opening valves (3) and (11) and vaporized under an initial vacuum of no more than about $10^{-2}$ torr, e.g., at $10^{-7}$ to $10^{-3}$ torr for a sufficient time to produce a surface coating of the agent. The vacuum is provided by a suitable vacuum pump positioned at the opposite end of the reactor (not shown). Following treatment with $TiCl_4$, valves (3) and (11) are closed. Optionally, the reactor (1) is evacuated for a short period of time to ensure removal of any vaporized pretreatment agent. The aluminum hydride precursor, e.g., $(Me_3N)_2AlH_3$, contained in a second reservoir (4) at one end of the reactor is then exposed to an initial vacuum by opening valves (3) and (12) and vaporized under a vacuum of no more than about $10^{-2}$ torr, e.g., at $10^{-7}$ to $10^{-3}$ torr. A carrier stream of an inert gas (e.g., He and/or Ar) can optionally be employed by passing it through a liquid or solid precursor and into the reaction chamber (5). The aluminum precursor vapor (8) then passes into a reaction chamber (5) that contains one or more units of the substrate (6). The substrate, e.g., wafers of Si<100>, are preferably held in a vertical position by a suitable holder (7). The reaction chamber is maintained at a specified temperature, by means of an external furnace (10), which is effective to decompose the aluminum precursor vapor (8) so as to deposit a film of aluminum (9) on the exposed surfaces of the substrate units. Preferably, the reaction chamber is maintained at about 25° C. to 200° C. during the deposition process, most preferably at about 50° C. to 150° C. The total pressure within the reaction chamber is generally within the range of about 0.01 torr to 2 torr. However, this pressure does not appear to be highly critical to the deposition of the mirror-like films of aluminum.

The pretreatment agent and precursor are generally maintained at a constant temperature during the vaporization process for ease of handling; however, this is not critical. The temperature of each is generally below their respective decomposition temperatures, but at a temperature such that they are sufficiently capable of being volatilized in the process of chemical vapor deposition.

The substrate is exposed to the pretreatment agent for a sufficient period of time such that an effective amount of the pretreatment agent is coated onto the surface of the substrate. Herein, an "effective amount" refers to an amount that is effective to produce a mirror-like film upon exposure of the substrate to the aluminum precursor. Generally, this is dependent upon the temperatures at which the substrate and pretreatment agent are maintained.

The substrate is exposed to the aluminum precursor for a sufficient period of time such that a mirror-like film of aluminum is deposited on the surface of the substrate. Generally, short deposition times, i.e., less than about 6 minutes, produce mirror-like finishes when the aluminum precursor is maintained at a temperature of about 25° C. and the substrate is maintained at a temperature of about 100° C. As with the pretreatment agent, the temperatures at which the substrate and aluminum precursor are maintained have an effect upon the exposure time of the substrate to the precursor vapor.

It is believed that the deposition, or growth, rates can effect the quality of the aluminum coating, i.e., the grain size and reflectivity. With slow depositions the quality of the coating is enhanced. That is, the coating is made up of smaller grain sized particles, and hence exhibits better reflectivity. Aluminum films with high specular reflectivities, i.e., greater than about 80%, are generally obtained with the precursors of this invention if the deposition rate is maintained at less than about 0.5 μm/minute.

Aluminum Precursors

Precursors for use in the method of this invention have the general formula $[(R^1R^2R^3)Y]_xAlH_3$ wherein: Y is a Group VA element; $R^1$, $R^2$, and $R^3$ are independently an alkyl, alkenyl, alkynyl, cycloalkyl, cycloalkenyl, alkaryl, aryl, or aralkyl group; and x is an integer having a value of 1 or 2. Preferably $R^1$, $R^2$, and $R^3$ are independently lower molecular weight groups: ($C_1$-$C_6$)alkyl, such as methyl, ethyl, propyl, butyl, pentyl, and hexyl; ($C_2$-$C_6$)alkenyl, such as propenyl or butenyl; ($C_2$-$C_6$)alkynyl, such as propynyl; ($C_3$-$C_8$)cycloalkyl, such as cyclopentanyl; ($C_4$-$C_8$)cycloalkenyl, such as cyclopentenyl; ($C_1$-$C_6$)alkaryl, such as styryl or tolyl; ($C_6$-$C_{10}$)aryl, such as phenyl; and aryl($C_1$-$C_6$)alkyl, such as benzyl. Included within this group of substituents are branched or straight chain hydrocarbon groups.

The most preferred precursors of the aluminum films prepared in accord with the present method are trialkyl (Group VA) aluminum hydrides wherein the preferred Group VA elements are nitrogen (N) and phosphorus (P). Most preferably, a trialkyl amine aluminum hydride of the general formula $[(R^1R^2R^3)N]_xAlH_3$, wherein $R^1$, $R^2$, and $R^3$ are independently a ($C_1$-$C_3$)alkyl group and x is 1 or 2, is used. That is, the alkyl group is preferably methyl, ethyl, propyl, or mixtures thereof, and most preferably, methyl or ethyl. Examples of the amine complexes of aluminum hydride are trimethylamine, triethylamine, tri-n-propylamine, triisopropylamine, methyl diethylamine, n-propyldimethylamine, and isopropyl diethylamine.

These compounds can be prepared from readily available starting materials by known synthetic methods. Bis(trimethylamine)aluminum hydride has been prepared by the reaction of $Me_3N.HCl$ with $LiAlH_4$ by E. Wiberg et al., vide supra and R. A. Kovar et al., vide supra, the disclosures of which are incorporated herein by reference. Triethylamine aluminum hydride has been prepared by the reaction of triethylamine HCl with lithium aluminum hydride by the procedure of E. Wiberg et al., vide supra, the disclosure of which is incorporated herein by reference. Trimethylphosphine aluminum hydride has been prepared by the reaction of trimethylphosphine with $(Me_3N)_2AlH_3$ by the procedure of E. Wiberg et al., vide supra, the disclosure of which is incorporated herein by reference. Certain of the amine-alanes and phosphine-alanes are preferable precursors because they are generally easier to prepare and handle since they are solids that can be sublimed.

$(Me_3N)_2AlH_3$ is an effective precursor for the formation of thin films of high reflectivity and purity, low resistivity aluminum in a low pressure chemical vapor deposition reactor. Gas phase studies by C. W. Heitsch, *Nature*, 195, 995 (1962) of $(Me_3N)_2AlH_3$ suggest that at 80° C. the predominant species in the gas phase is $(Me_3N)AlH_3$. Although less well-documented, higher temperatures are reported to cause dissociation of the second $Me_3N$ to release $AlH_3$. Studies of the thermal decomposition of liquid $(Me_3)_2AlH_3$ and $(Me_3N)AlH_3$ have also suggested that dissociation of the $Me_3N$ precedes hydrogen loss. See G. N. Nechiporenko et al., *Izv. Akad. Nauk SSSR, Ser. Khimicheskaya*, 1697 (1975).

The reactor temperature is generally maintained within the range of 25° C. to 200° C., preferably within the range of 50° C. to 150° C. However, the choice of precursor can determine the choice of reactor temperature. For example, when $(Me_3N)_2AlH_3$ is the precursor, the most preferred range is 85° C. to 150° C., and when $(Et_3N)AlH_3$ is the precursor, the most preferred range is 25° C. to 120° C. The low temperatures of deposition make $(Me_3N)_2AlH_3$ and $(Et_3N)AlH_3$ especially attractive for forming aluminum coatings on temperature sensitive substrates.

While the total pressure in the reactor of the invention is not directly measured, and this pressure does not appear to have a significant impact on the formation of mirror-like films of aluminum, the pressure is generally estimated to be within the range of 0.01 torr to 2 torr in the reactor. The direct pressure measurement is taken after the liquid nitrogen trap and the hydrogen pressure is monitored. For a reactor temperature of 180° C., the hydrogen pressure is generally about 0.2 torr. It is expected that the pressure in the reactor would be somewhat higher, but generally less than the equilibrium vapor pressure of the precursor, which for $(Me_3N)_2AlH_3$ is 1.8 torr at 25° C.

Pretreatment Agent

Transition metal complexes suitable for use as pretreatment agents in the method of preparing mirror-like aluminum films on various substrates are compounds of the Group IVB and VB transition metals. This includes compounds of titanium, hafnium, zirconium, vanadium, niobium, and tantalum. Included within this group are, for example, $ZrCl_4$, $NbCl_5$, $VOCl_3$, $VOCl_2$, $TiCl_3$, $TiCl_4$, $TiCl_4.2OEt_2$, $TiBr_4$, $TiI_4$, $VCl_4$, $TiCl_2(OEt_2)_2$, $TiCl_2(i-OC_3H_7)_2$, $Ti(BH_4)_2.2OEt_2$, and mixtures thereof. The chlorides, bromides, and oxychlorides of titanium, niobium, vanadium, and zirconium are generally thought to be more effective, with $TiCl_4$ being one of the most effective in achieving a more even distribution of aluminum, smaller crystallites, and hence a mirror-like coating of aluminum.

The interaction of the pretreatment agent with the substrate surface is not fully understood. It may be that the material is adsorbed onto the surface, and that less than a monolayer of $TiCl_4$ is actually adsorbed. It should be kept in mind, however, that when the substrate is Si<100>, silica, or glass, there are available hydroxyl groups that offer a route, via a possible intermediate such as Si-O-$TiCl_3$, for binding the titanium to the surface.

While the role of the pretreatment agent, e.g., $TiCl_4$, is not presently known, and the inventors do not wish to be held to any particular theory, it can be speculated that the advantages may result, at least in part, from the interaction of $TiCl_4$ with alane, a powerful reducing agent. It is thought that a factor that may contribute to the surface roughness of films in the absence of a pretreating agent is the gas phase nucleation of particles of Al or $(AlH_3)_n$, which would then coat the surface. Evidence of an interaction between $TiCl_4$ and alane can be observed in the trap placed at the exit of the CVD reactor. Even at very low temperatures ($-100°$ C.), dark green to blue coloration is observed, and as the trap is further warmed towards room temperature, a very exothermic reaction takes place. While no spectral data regarding the products is yet available, it is anticipated that Ti-H [or perhaps aluminohydride, $Ti(AlH_4)$] complexes form initially. Reductive elimination of $H_2$ from the titanium would be expected to be facile, thus providing a route to metallic aluminum.

Substrates

The present method is described primarily by reference to examples involving the deposition of aluminum films on Si<100> surface, polyimide films, and glass. However, it is expected that the surfaces of other crystal plane orientations of silicon and/or other substrates can be effectively coated with a film of aluminum by the present method, for a variety of end-uses, as discussed hereinabove. Such substrates include, but are not limited to, Si<311>, Si<111>, Si<110>, GaAs<110>, GaAs<111>, GaAs<311>, $SnO_2$, and various $SiO_2$ glasses, paper, wood, synthetic fibers and fabrics, cotton, ceramic materials, cermets, nonmetallic refractories and polymers. Any substrate that is generally stable, i.e., does not substantially decompose, under the conditions employed in the method of the present invention, are suitable for use. That is, the aluminum films are generally adherent to a wide variety of materials and highly adherent to polyimide films. Therefore, it is to be understood that this method of aluminum deposition is not substrate-specific.

The invention will be further described by reference to the following detailed examples, wherein X-ray diffraction data were obtained on a Siemens D500 diffractometer using graphite monochromatized Cu K$\alpha$ radiation and scintillation detection. Alignment was determined using the Si<400> reflection. All film thickness measurements were performed on a Tencor Alphastep stylus profilometer. Resistivities were measured using a Veeco FPP-5000 four-point probe. The microscopic surface structure of the films was examined by electron microscopy using a JEOL 840 II Scanning Electron Microscope. Auger electron spectra were measured on a Perkin Elmer Corporation/Physical Electronics Division model 555 electron spectrometer. Reflectivity measurements were made on a Perkin Elmer Lambda 9 UV-Vis-NIR spectrophotometer.

EXAMPLE 1

Chemical Vapor Deposition of Thin Films of Aluminum

The reactor employed in the low pressure chemical vapor deposition of aluminum was an all-glass, horizontal tube, low pressure CVD reactor. FIG. 1 shows a schematic of the system. The pressure of the system (1) was maintained with an oil diffusion pump capable of base pressures of $3 \times 10^{-5}$ torr The reaction tube(s) itself was made of quartz and had an inside diameter of 2.6 cm.

The temperature of the tube furnace was monitored by thermocouples placed above and below the quartz tube at 4.5 cm (in the middle of the region where the substrates were placed) from the edge of the tube furnace heating coils (on the precursor entry side of the tube). The substrate temperatures in the tube were not monitored during a deposition. The numbers quoted as the deposition temperatures were obtained by a separate calibration of the internal temperature against the external thermocouple readings.

Si<100> wafers were degreased/etched by immersion in the following baths according to the order listed for 10 minutes each: tetrachloroethylene, ethanol, deionized water, dilute HF, and deionized water. Glass microscope slides and strips of polyimide film (Du Pont KAPTON Type H) were cut to fit in the tube and were treated in the same fashion as the silicon wafers with the exclusion of the HF etching treatment. After air drying, the substrates were placed in the tube in a Macor ceramic holder (7) to hold them in a vertical position during the deposition. The distance between the adjacent wafers was 6 mm. Alternatively, the substrate wafers can be laid flat on the bottom of the reactor tube. Masking of the wafers was achieved by placing two wafers in direct contact with one another. After placing the substrate into the reactor, the reactor was evacuated and heated to the desired reaction temperature. The reactor was then maintained at the desired temperature for a minimum of one hour, prior to initiating a run.

The entrance to the quartz tube was fitted with a valve (3) leading to a vessel (2) containing the $TiCl_4$, which was fitted with a valve (11), and a second vessel (4) containing $(Me_3N)_2AlH_3$, which was fitted with a valve (12). The vessel containing $TiCl_4$ was cooled to 10.0° C. with a HAAKE A81 circulating bath (not shown) and opened to the reactor, by opening valves (3) and (11), for one minute while pumping was maintained. The tube was then evacuated for about 20 to 30 minutes prior to opening the vessel containing $(Me_3N)_2AlH_3$.

In a typical deposition the vessel containing the $(Me_3N)_2AlH_3$ precursor (4) was opened to the reaction chamber by opening the valves (3) and (12). The valves were allowed to remain open for four minutes during which time the inside of the quartz tube and the substrates were coated with an aluminum film. The vessel containing the $(Me_3N)_2AlH_3$ was also maintained at a constant temperature, with a similar bath as above, usually at about 25° C. Upon completion of the deposition the system was allowed to return to its original pressure before opening. The pressure was monitored with an Inficon capacitance manometer placed between the pump and the liquid nitrogen cooled trap located at the exit of the furnace.

At the exit of the furnace a small amount of a crystalline deposit of $(Me_3N)_2AlH_3$ precursor was observed. Unreacted precursor was also found in the liquid nitrogen cooled trap placed between the reactor and the diffusion pump. Since the trap was located between the capacitance manometer and the reactor, the pressures measured resulted from the hydrogen expelled during the deposition. This appeared to be a sensitive measure of the reproducibility of a given set of reaction conditions. The behavior usually observed is best described with a specific example. With the precursor vessel at 25° C. and the furnace at 180° C., the pressure would stabilize at a constant value of approximately 0.2 torr. The observed pressures were decreased by both a lower furnace temperature and a lower precursor vessel temperature.

The rate of aluminum deposition was determined by masking part of the wafers prior to the deposition and measuring the step height created for a given deposition time. With a precursor temperature of 25° C. and the reaction tube at 100° C., the deposition rate was about 0.06 μm/min, which produced a mirror-like film. The results of single depositions under different conditions are given in Table 1.

TABLE 1

| Typical Deposition Conditions and Results of Deposition of Si<100> | | | | | | |
|---|---|---|---|---|---|---|
| T (precursor) (°C.) | T (reactor) (°C.) | TiCl$_4$ Pretreatment | Time (min) of Al deposition | Growth rate (μm/min) | Resistivity (μΩ-cm) | Surface Finish |
| 25 | 280 | No | 4.0 | 2.9 | 3.9 | Chalky |
| 25 | 180 | No | 4.0 | 0.8 | 3.3 | Milky |
| 25 | 180 | Yes | 4.0 | 1.0 | 4.5 | Milky |
| 25 | 100 | Yes | 2.0 | 0.06 | 3.5 | Mirror |
| 25 | 180 | Yes | 6.0 | 1.0 | 3.2 | Milky |
| 25 | 180 | Yes | 2.0 | 0.6 | 3.8 | Milky |

In depositions where the reactor and its contents were treated with TiCl$_4$ prior to the alane precursor, a more even distribution of the aluminum layer was observed. On the edges of these films on the quartz reactor tube, a gray, chalky, nonreflective portion was observed. It is believed that this may be due to small particles of aluminum that have not yet formed a continuous film.

EXAMPLE II

Characterization of the Aluminum Films

Auger Spectroscopy

Figure 2A:
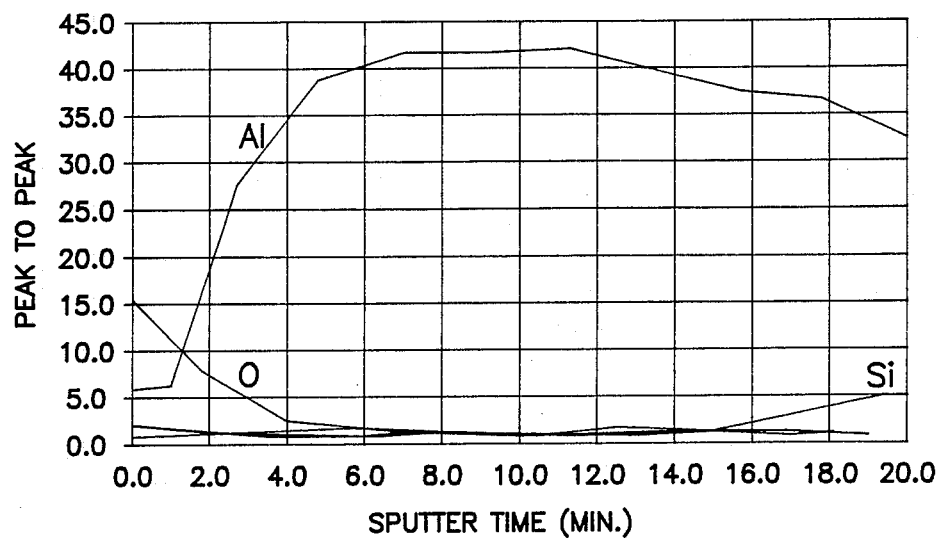
FIG. 2a is a graph of the Auger electron intensity as a function of sputtering time of an aluminum film deposited on Si<100> in accord with the present invention (the carbon and nitrogen lines are shown but not separately labeled).

FIG. 2a shows the results of the Auger electron spectral profile, i.e., electron intensity, as a function of sputtering time. The top layers of the film exhibit the usual oxide coating along with carbon and nitrogen, all of which are absorbed from the atmosphere. All of these elements decreased rapidly to within the detection limits of the method as the sputtering proceeded. In the films where TiCl$_4$ was used to pretreat the surface, no titanium or chlorine was detected in the aluminum films or at the interface with the silicon wafer. This is consistent with the absorption of less than a monolayer of TiCl$_4$ during the pretreatment.

Figure 2B:
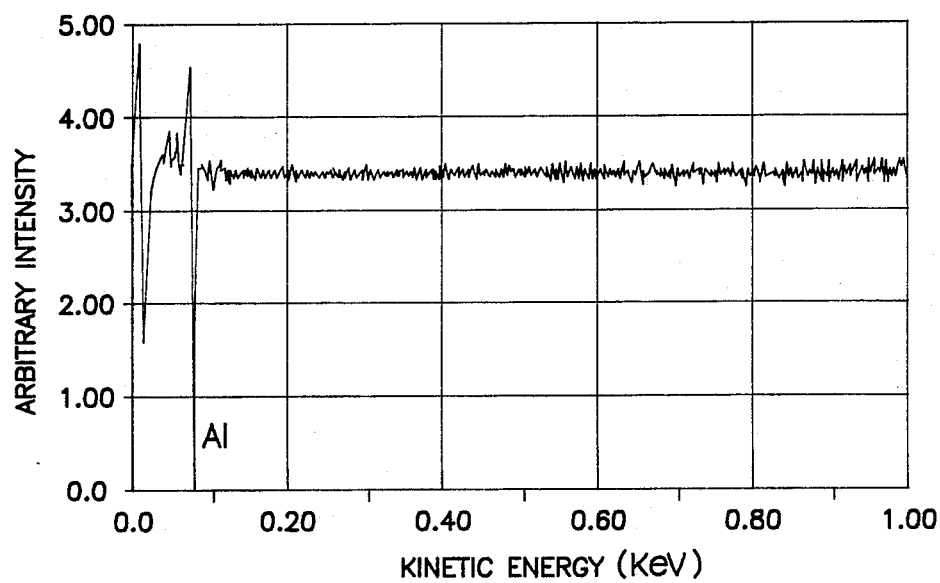
FIG. 2b depicts the Auger electron spectrum obtained after 15 minutes of sputtering.

FIG. 2b is a graph of intensity versus binding energy. The peak is a derivative of the number of electrons counted per unit time. After 15 minutes of sputtering of the coated surface, the Auger spectrum of the surface displayed only Al (68 keV).

X-Ray Diffraction

Figure 3A:
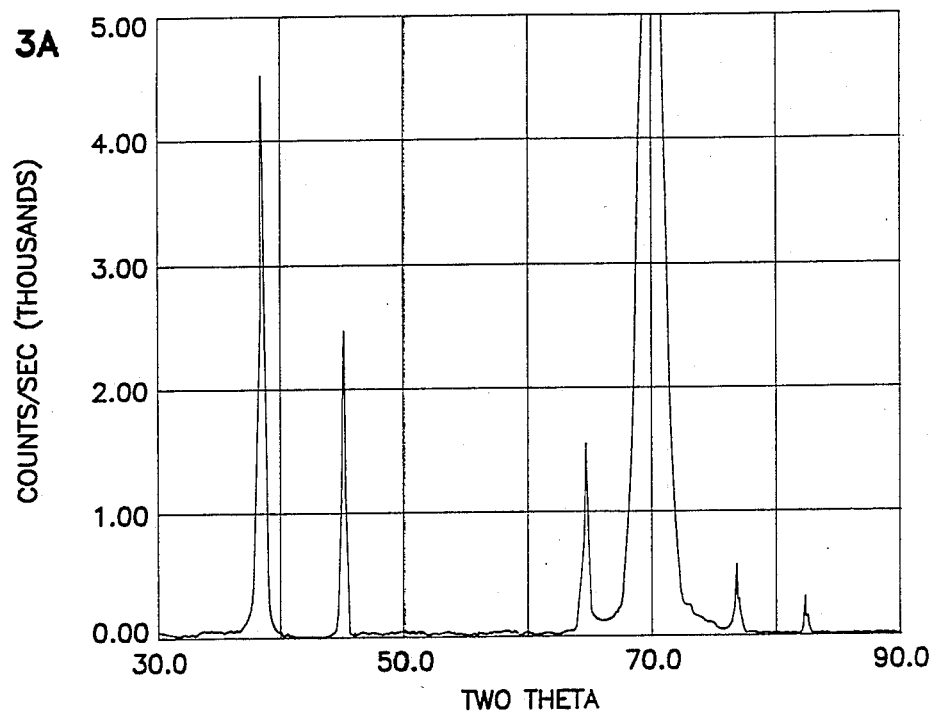
FIG. 3 depicts the X-ray diffraction spectra of thin films deposited in accord with the present invention on:
  (a) Si<100> at 280° C. without any $TiCl_4$ pretreatment, and on
  (b) Si<100> at 100° C. following treatment of the substrate with $TiCl_4$.
Figure 3B:
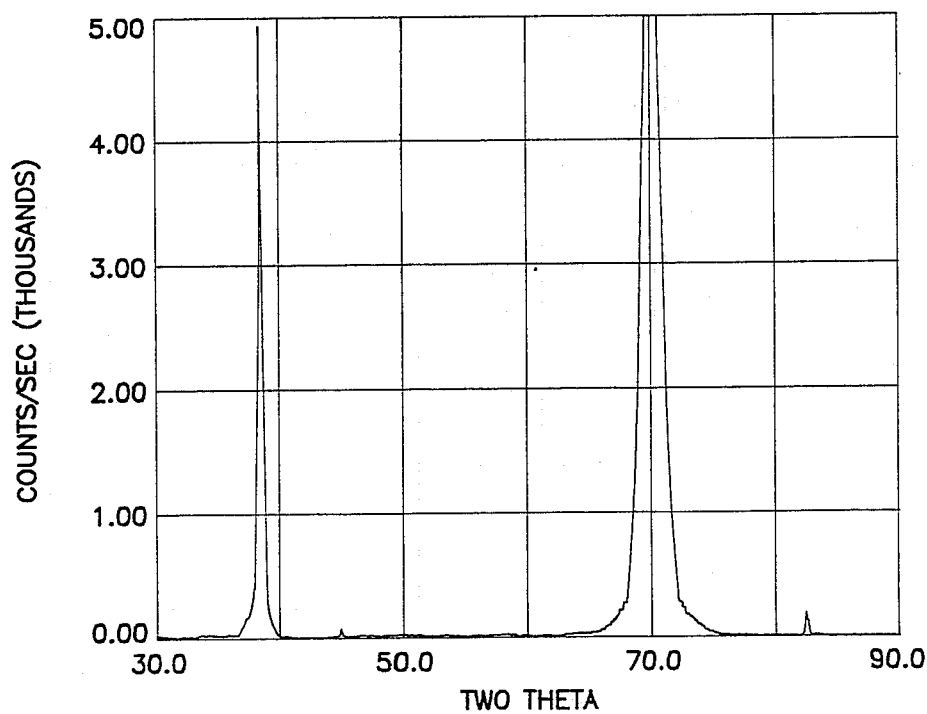
Figure 4:
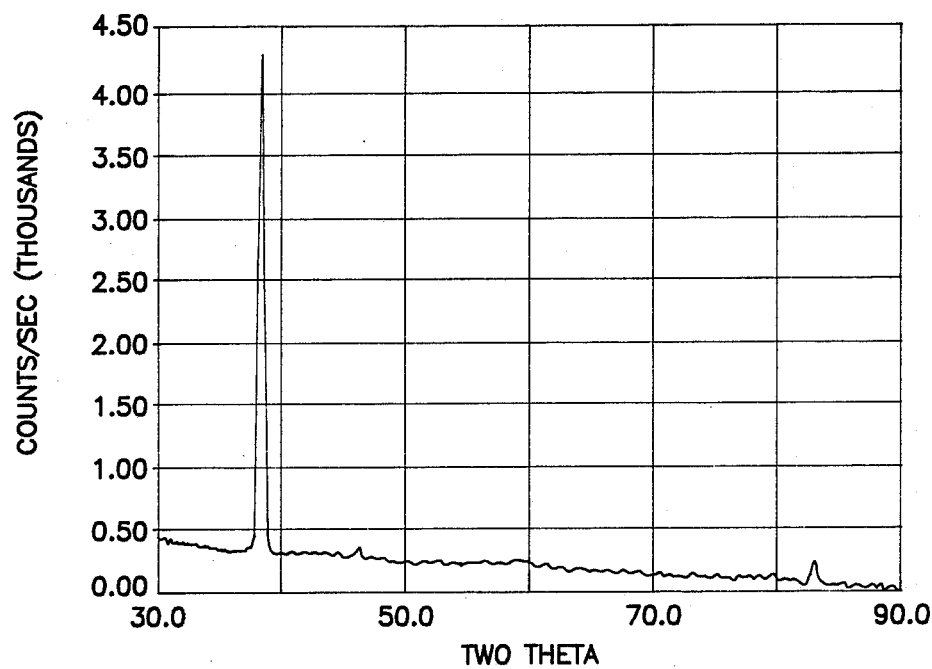
FIG. 4 depicts the X-ray diffraction spectrum of an aluminum film deposited at 100° C. on a $TiCl_4$ treated polyimide film.

The X-ray diffraction spectrum of polycrystalline aluminum films grown on the surface of Si<100> or glass slides at 280° C. without TiCl$_4$. pretreatment is shown in FIG. 3a. Thick films (approximately >1 μm) deposited without any TiCl$_4$ pretreatment gave nearly the expected intensity distributions; see Powder Diffraction File, International Center for Diffraction Data, Swarthmore, PA, Card #4-0787. An increasing deviation from the polycrystalline aluminum pattern was observed for films as they became thinner, however. The 2θ values (deg), with their relative intensities and assignments for polycrystalline aluminum, are: 38.47 (1.00) <111>, 44.74 (0.47) <200>, 65.13 (0.22) <220>, 78.22 (0.24) <311>, 82.432 (0.07) <222>. The reflection at 69.17° is due to the substrate. FIG. 3b shows the striking effect caused by pretreating the surface with TiCl$_4$ and growing the films at 100° C. The films show nearly complete preference for growing with the Al <111> face parallel to the surface. While FIG. 3b was taken from a film grown on Si<100>, similar patterns were obtained on simple glass slides. FIG. 4 clearly illustrates this same orientation preference, i.e., Al<111> parallel to the surface, on TiCl$_4$ pretreated polyimide films with aluminum deposited at 100° C.

Electron Microscopy

Figure 5:
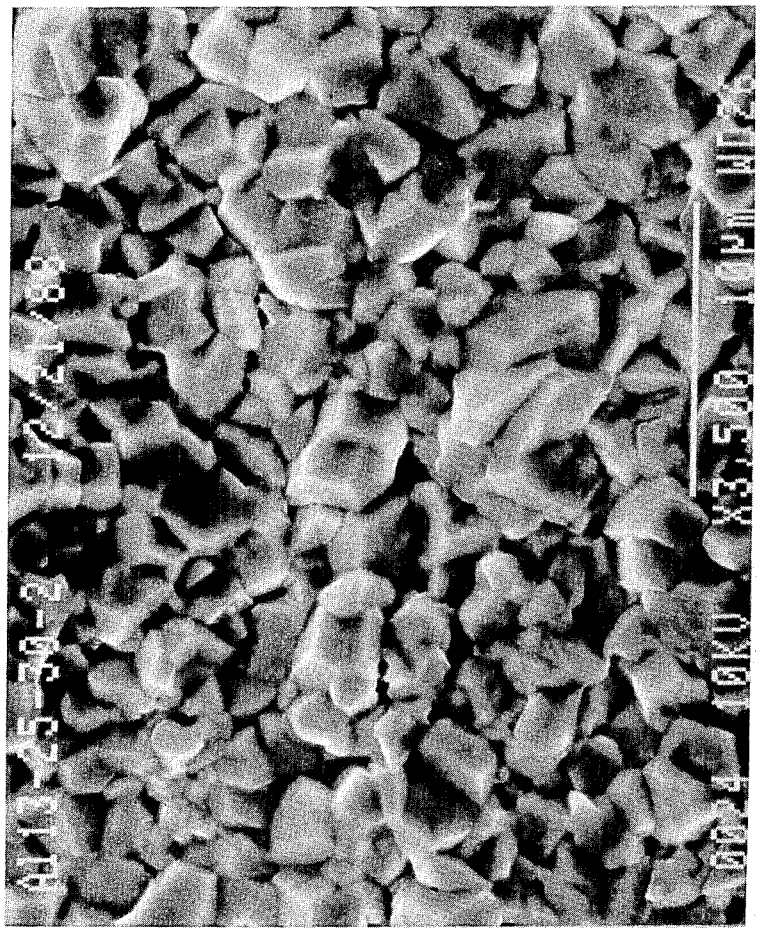
FIG. 5 depicts a scanning electron micrograph (SEM) of the surface of an aluminum film grown at 180° C. on Si<100> without any $TiCl_4$ pretreatment. The bar in the lower right corner represents 10 $\mu$m.
Figure 6:
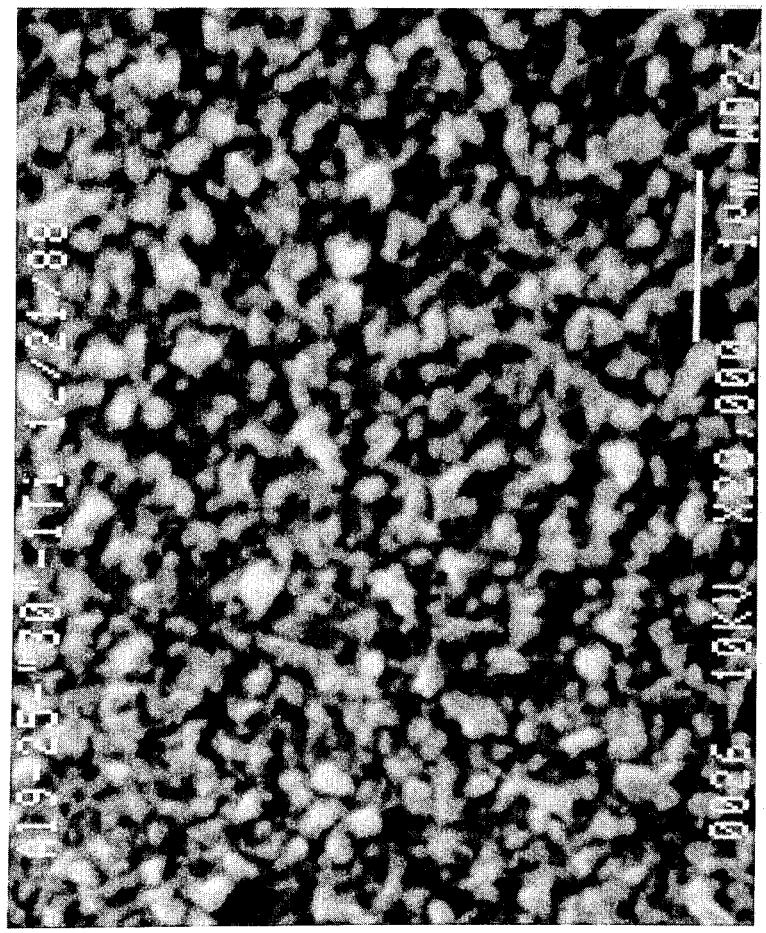
FIG. 6 depicts an SEM of the surface of a mirror-like aluminum film grown at 100° C. on Si<100> that was treated with $TiCl_4$ prior to the aluminum deposition. The bar in the lower right corner represents 1 $\mu$m.

The microstructure of the films was examined using scanning electron microscopy (SEM), and, once again, a dramatic effect of pretreating the film with TiCl$_4$ was observed. FIG. 5 shows the scanning electron micrograph of the surface of a rough film typical of those deposited without TiCl$_4$ pretreatment. The grain size observed averages 2–3 μm. The photograph shows the large gaps between grains that are responsible for the roughness of the surface. For masked wafers, in the regions near the edge of the aluminum created by the mask, small crystallites of aluminum were visible on the silicon. Scanning towards the aluminum film revealed an increase in crystallite size, but not a corresponding increase in the number of small crystallites. This suggests that the rate of crystallite growth is greater than the rate of nucleation, which undoubtedly contributes to the surface roughness of the final film. Those films grown on Si<100> wafers or glass slides that were pretreated with TiCl$_4$ exhibited a much higher number of small crystallites in this same near-edge region. On those films grown on pretreated surfaces at 180° C. the grains averaged 1 μm, whereas the films grown on pretreated surfaces at 100° C. exhibited an average grain size of 0.15 μm. FIG. 4 shows the scanning electron micrograph of this latter surface.

Resistivity

The resistivities of the films were evaluated using a four-point probe. The results are summarized in Table 1. The low resistivities observed are near that of bulk aluminum The sensitivity of the resistivity measurement to small concentrations of impurities verified the high purity of these Al films.

Reflectivity

Figure 7:
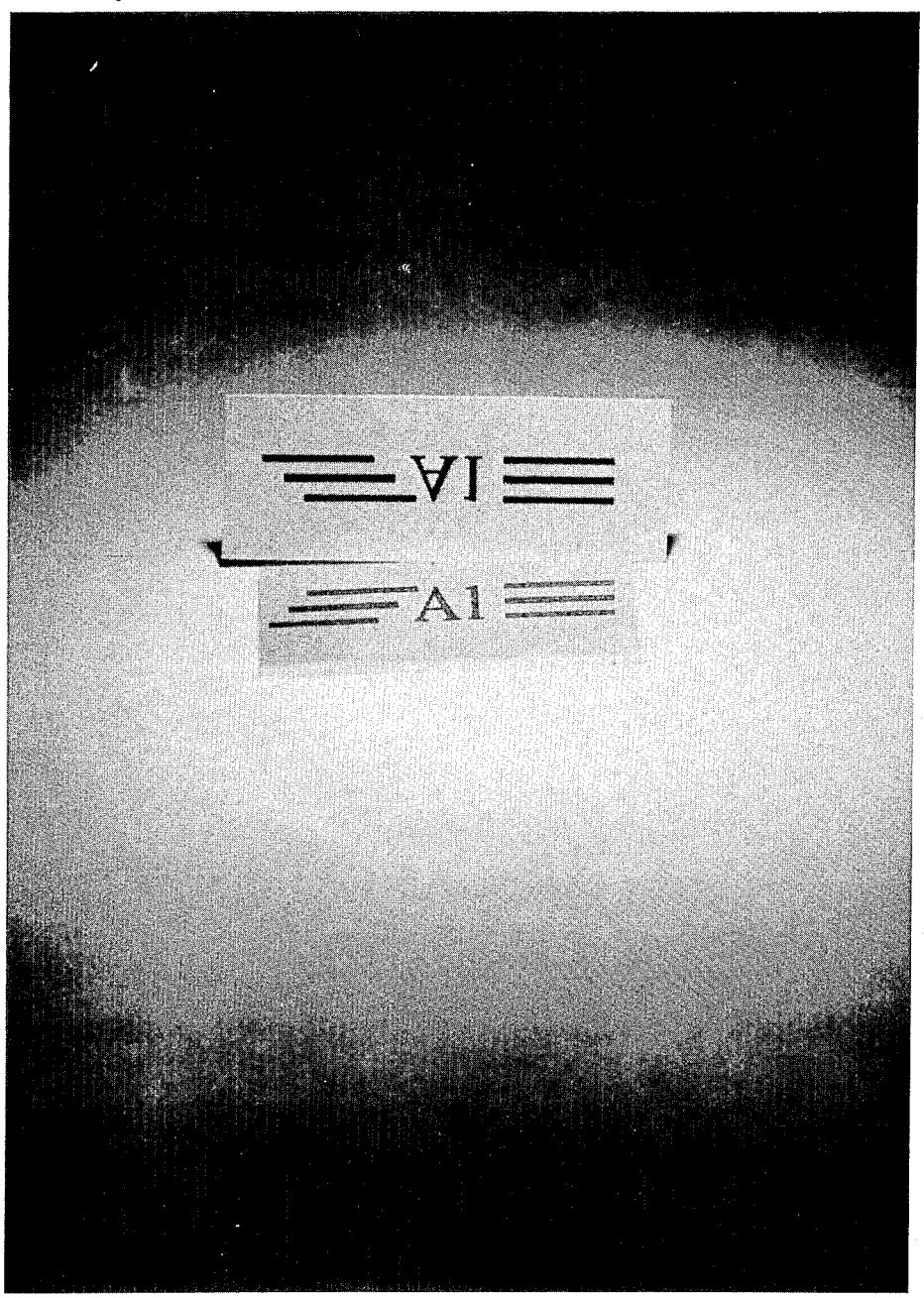
FIG. 7 is a photograph illustrating the reflectivity and smoothness of the present aluminum films grown at 100° C. with $TiCl_4$ pretreatment.

The surface roughness of many of the films not subjected to TiCl$_4$ pretreatment caused their specular reflectivity to be very low. Specular reflectivity relates to the intensity of the radiation reflected at the specular angle, i.e., the angle between surface and the reflected beam that is equal to the angle between the surface and the incident radiation. Typically, the total reflectivity, i.e., specular plus diffuse, was greater than 90% at a wavelength of 550 nm, but the specular contribution to this value was less than 5%. These films wherein the substrate had not been treated with TiCl$_4$ prior to aluminum deposition could be described as generally milky, cloudy, chalky, and in some situations shiny or metallic. For the films grown at 100° C. on TiCl$_4$ treated surfaces, the relative contributions of the diffuse and specular components to the total reflectivity were reversed, i.e., diffuse generally less than 5%. FIG. 7 illustrates the high specular reflectivity of these films (the actual value of the specular reflectivity of these mirror-like films at 550 nm was about 85%). Similar reflectivities were also obtained from aluminum deposited on treated polyimide films.

The invention has been described with reference to various specific and preferred embodiments and techniques. However, it should be understood that many variations and modifications may be made while remaining within the spirit and scope of the invention.

What is claimed is:

1. A method for applying an aluminum film to the surface of a substrate comprising employing the techniques of flowthrough chemical vapor deposition to:
   (a) expose the surface to a first vapor comprising a Group IVB or VB metal complex; and
   (b) expose the surface to a second vapor to deposit a mirror-like coating of aluminum thereon; said second vapor comprising a compound of the formula $[(R^1R^2R^3)Y]_x AlH_3$ wherein:
   (i) Y is a Group VA element;
   (ii) $R^1$, $R^2$, and $R^3$ are independently alkyl, alkenyl, alkynyl, cycloalkyl, cycloalkenyl, alkaryl, aryl, or aralkyl; and
   (iii) x is an integer with a value of 1 or 2.

2. The method of claim 1 wherein Y is N or P.

3. The method of claim 1 wherein the deposition is carried out at about 25° C. to 200° C.

4. The method of claim 1 wherein $R^1$, $R^2$, and $R^3$ are independently a ($C_1$–$C_3$)alkyl group.

5. The method of claim 4 wherein the compound is (Me$_3$N)$_2$AlH$_3$.

6. The method of claim 5 wherein the deposition is carried out at about 85° C. to 150° C.

7. The method of claim 4 wherein the compound is (Et$_3$N)AlH$_3$.

8. The method of claim 7 wherein the deposition is carried out at about 25° C. to 120° C.

9. The method of claim 1 wherein the surface comprises silicon, tin oxide, gallium arsenide, silica, glass, polyimide, or polymethyl-methacrylate.

10. The method of claim 1 wherein the aluminum coating is deposited with an Al<111> face parallel to the surface.

11. The method of claim 1 wherein said second vapor is formed by evaporating a liquid or a solid amine-alane complex at a pressure of no more than about $10^{-2}$ torr.

* * * * *

UNITED STATES PATENT AND TRADEMARK OFFICE
CERTIFICATE OF CORRECTION

PATENT NO.   :   4,923,717

DATED        :   May 8, 1990

INVENTOR(S)  :   Gladfelter et al.

It is certified that error appears in the above-identified patent and that said Letters Patent is hereby corrected as shown below:

Abstract, line 4, insert the line --[trialkyl(Group VA) element]-- before "aluminum";

Column 6, line 10, "$(Me_3)_2AlH_3$" should be --$(Me_3N)_2AlH_3$--.

Signed and Sealed this

Thirty-first Day of March, 1992

Attest:

HARRY F. MANBECK, JR.

*Attesting Officer*         *Commissioner of Patents and Trademarks*